United States Patent
Zhang et al.

(10) Patent No.: US 10,685,593 B2
(45) Date of Patent: Jun. 16, 2020

(54) SINGLE TYPE GOA CIRCUIT

(71) Applicant: WUHAN CHINA STAR OPTOELECTRONICS TECHNOLOGY CO., LTD, Wuhan (CN)

(72) Inventors: Xin Zhang, Wuhan (CN); Juncheng Xiao, Wuhan (CN); Yanqing Guan, Wuhan (CN); Chao Tian, Wuhan (CN)

( * ) Notice: Subject to any disclaimer, the term of this patent is extended or adjusted under 35 U.S.C. 154(b) by 0 days.

(21) Appl. No.: 16/342,209

(22) PCT Filed: Sep. 11, 2018

(86) PCT No.: PCT/CN2018/105033
§ 371 (c)(1),
(2) Date: Apr. 16, 2019

(87) PCT Pub. No.: WO2020/019422
PCT Pub. Date: Jan. 30, 2020

(65) Prior Publication Data
US 2020/0082746 A1 Mar. 12, 2020

(30) Foreign Application Priority Data
Jul. 24, 2018 (CN) .......................... 2018 1 0819375

(51) Int. Cl.
*G09G 3/20* (2006.01)
(52) U.S. Cl.
CPC ....... *G09G 3/20* (2013.01); *G09G 2300/0408* (2013.01); *G09G 2300/0426* (2013.01); *G09G 2300/0809* (2013.01); *G09G 2310/0267* (2013.01)

(58) Field of Classification Search
CPC ... G09G 2300/0408; G09G 2300/0809; G09G 2310/0267; G09G 3/20
See application file for complete search history.

(56) References Cited

U.S. PATENT DOCUMENTS

| | | | |
|---|---|---|---|
| 2016/0163400 A1 | 6/2016 | Yu et al. | |
| 2016/0164514 A1 | 6/2016 | Xiao | |
| 2016/0358572 A1* | 12/2016 | Xiao | G11C 19/287 |
| 2017/0110075 A1 | 4/2017 | Cao et al. | |
| 2017/0193956 A1* | 7/2017 | Xiao | G02F 1/133514 |
| 2017/0256217 A1* | 9/2017 | Xiao | G09G 3/3677 |
| 2018/0046308 A1* | 2/2018 | Xiao | G06F 3/0416 |

(Continued)

FOREIGN PATENT DOCUMENTS

| | | |
|---|---|---|
| CN | 104464665 A | 3/2015 |
| CN | 104464817 A | 3/2015 |
| CN | 105206238 A | 12/2015 |

(Continued)

*Primary Examiner* — Kent W Chang
*Assistant Examiner* — Nathaniel P Brittingham

(57) ABSTRACT

A pixel driving circuit is provided. The pixel driving circuit comprises a reset module, a compensation module and light emitting module, wherein the reset module is configured to transmit a data signal to the compensation module to reset the compensation module under controlling of a first driving signal, the compensation module is configured to write the data signal to compensate a threshold voltage under controlling of a second driving signal, and the light emitting module is configured to emit light under controlling of a third driving signal.

14 Claims, 2 Drawing Sheets

(56) References Cited

U.S. PATENT DOCUMENTS

2018/0068628 A1* 3/2018 Xiao .................... G09G 3/3648
2019/0130858 A1* 5/2019 Xiao .................... G09G 3/3677

FOREIGN PATENT DOCUMENTS

| CN | 107749281 A | 3/2018 | | |
|---|---|---|---|---|
| JP | 2003316329 A | 11/2003 | | |
| KR | 20080054567 A | 6/2008 | | |
| WO | WO-2017117846 A1 * | 7/2017 | ........... | G09G 3/3677 |

* cited by examiner

US 10,685,593 B2

SINGLE TYPE GOA CIRCUIT

FIELD OF INVENTION

The present disclosure relates to a gate driver on array (GOA) circuit, and in particular to single type GOA circuit.

BACKGROUND OF INVENTION

Generally, in the prior art, in an array process stage of the liquid crystal display panel, a gate driving circuit is formed on an array substrate using gate driver on array (GOA) technology, thereby performing scan driving on the gate lines line by line. The technology can reduce a bonding process of external IC chips and improve integration of the liquid crystal display panel. Furthermore, the GOA circuit typically includes multiple levels of GOA units, and each level of the GOA unit drives a horizontal scan line, and the GOA unit comprises a pull-up unit, a pull-up controlling unit, a pull-down unit, a pull-down holding unit, a voltage boosting unit, and a reset unit, wherein the pull-up unit is configured to output a clock signal as a gate signal, the pull-up controlling unit is configured to control a working time of the pull-up unit and connected to a downlink signal output by the previous level GOA unit, the pull-down unit is configured to pull the gate signal to a voltage, the pull-down holding unit is configured to hold the gate signal and maintain the controlling signal of the pull-up unit at a low voltage.

However, the GOA unit of NMOS transistor requires a high voltage at the level transmission of holding signal through the capacitance of the Q node, and thin film transistor (TFT) is not an ideal transistor. Even in the case of shutdown, the TFT still has a certain leakage current so that the touch period (TP term) lasts long. The touch panel (TP) pause level requires a long time to maintain a high voltage, thereby reducing level transmission stability of the GOA unit.

SUMMARY OF INVENTION

An object of the present disclosure is to provide a single type gate driver on array (GOA) circuit, the leakage path of switching element can be reduced and the reliability of level transmission of the GOA unit can be enhanced through disposing a voltage stabilizing unit.

The present disclosure provides a single type GOA circuit, which comprises a plurality of cascade GOA units, the nth stage GOA unit comprising: a pull-up controlling unit, a pull-down controlling unit, a pull-up unit, a pull-down unit, a voltage stabilizing unit, and a circuit detecting unit, wherein the pull-up controlling unit comprises a first switching element (NT1), a second switching element (NT2), a sixth switching element (NT6), and a seventh switching element (NT7); the first switching element (NT1) comprises a first end connected to a forward scan signal (U2D) and a second end formed with a Q1 node; the second switching element (NT2) comprises a first end connected to a reverse scan signal (D2U) and a second end connected to the second end of the first switching element (NT1); the sixth switching element (NT6) comprises a first end connected to the pull-down controlling unit and a second end connected to a low voltage level terminal (VGL); the seventh switching element (NT7) comprises a first end formed with a Q2 node and a second end connected to the pull-up unit; the pull-up unit is connected to the pull-down unit, the voltage stabilizing unit is connected between the Q1 node and the Q2 node, a leakage path of the second switching element (NT2) is reduced through connecting the voltage stabilizing unit to a high voltage level terminal (VGH), and the circuit detecting unit is configured to be connected to the pull-up unit and the pull-down unit.

In one embodiment of the present disclosure, the voltage stabilizing unit comprises a first voltage switching element (NT7-1), the first voltage switching element (NT7-1) comprises a controlling end connected to the Q1 node, a first end connected to the high voltage level terminal (VGH), and a second end connected to a controlling end of the sixth switching element (NT6).

In one embodiment of the present disclosure, the voltage stabilizing unit further comprises a second voltage switching element (NT5-1), the second voltage switching element (NT5-1) comprises a controlling end connected to the first end of the sixth switching element (NT6), a first end connected to the Q1 node, and a second end connected to the low voltage level terminal (VGL).

In one embodiment of the present disclosure, the voltage stabilizing unit further comprises a third voltage switching element (NT6-1), the voltage switching element (NT6-1) comprises a controlling end connected to the second end of the second switching element (NT2), a first end connected to the controlling end of the second voltage switching element (NT5-1), and a second end connected to the low voltage level terminal (VGL).

In one embodiment of the present disclosure, the voltage stabilizing unit further comprises a stabilizing capacitor, the stabilizing capacitor is connected between the Q1 node and the low voltage level terminal (VGL).

In one embodiment of the present disclosure, before a voltage of the Q1 node is reduced, the high voltage level terminal (VGH) charges the Q2 node through the first voltage switching element (NT7-1), so that the single type GOA circuit maintains the Q2 node at a high voltage during a touch-control time.

In one embodiment of the present disclosure, the pull-up unit comprises a ninth switching element (NT9), the ninth switching element (NT9) comprises a first end connected to a clock signal, a second end connected to a first end of a tenth switching element (NT10) of the pull-down unit and an output of the single type GOA circuit, and a controlling end connected to the second end of the seventh switching element (NT7).

In one embodiment of the present disclosure, the pull-down unit comprises a tenth switching element (NT10), the tenth switching element (NT10) comprises a first end connected to a second end of a ninth switching element (NT9) of the pull-up unit, a second end connected to the low voltage level terminal (VGL), and a controlling end connected to the pull-down controlling unit.

In one embodiment of the present disclosure, the pull-down controlling unit comprises a third switching element (NT3), a fourth switching element (NT4), an eighth switching element (NT8), and a fifth switching element (NT5); wherein the third switching element (NT3) comprises a controlling end connected to the forward scan signal (U2D), a first end connected to an (n+1)th stage clock signal (CK(n+1)); the fourth switching element (NT4) comprises a controlling end connected to the reverse scan signal (D2U), a first end connected to an (n−1)th stage clock signal (CK(n−1)), and a second end connected to a second end of the third switching element (NT3); the eighth switching element (NT8) comprises a controlling end connected to the second end of the third switching element (NT3), a first end connected to the high voltage level terminal (VGH), and a second end connected to the first end of the sixth switching element (NT6); the fifth switching element (NT5) comprises a controlling end connected to a controlling end of a tenth switching element (NT10) of the pull-down unit, a first end connected to the Q2 node, and a second end connected to the low voltage level terminal (VGL).

The present disclosure further provides a single type GOA circuit, which comprises a plurality of cascade GOA units, the nth stage GOA unit comprising: a pull-up controlling unit, a pull-down controlling unit, a pull-up unit, a pull-down unit, a voltage stabilizing unit, and a circuit detecting unit, wherein the pull-up controlling unit comprises a first switching element (NT1), a second switching element (NT2), a sixth switching element (NT6), and a seventh switching element (NT7); the first switching element (NT1) comprises a first end connected to a forward scan signal (U2D) and a second end formed with a Q1 node; the second switching element (NT2) comprises a first end connected to a reverse scan signal (D2U) and a second end connected to the second end of the first switching element (NT1); the sixth switching element (NT6) comprises a first end connected to the pull-down controlling unit and a second end connected to a low voltage level terminal (VGL); the seventh switching element (NT7) comprises a first end formed with a Q2 node and a second end connected to the pull-up unit; the pull-up unit is connected to the pull-down unit, the voltage stabilizing unit is connected between the Q1 node and the Q2 node, a leakage path of the second switching element (NT2) is reduced through connecting the voltage stabilizing unit to a high voltage level terminal (VGH).

In one embodiment of the present disclosure, the voltage stabilizing unit comprises a first voltage switching element (NT7-1), the first voltage switching element (NT7-1) comprises a controlling end connected to the Q1 node, a first end connected to the high voltage level terminal (VGH), and a second end connected to a controlling end of the sixth switching element (NT6).

In one embodiment of the present disclosure, the voltage stabilizing unit further comprises a second voltage switching element (NT5-1), the second voltage switching element (NT5-1) comprises a controlling end connected to the first end of the sixth switching element (NT6), a first end connected to the Q1 node, and a second end connected to the low voltage level terminal (VGL).

In one embodiment of the present disclosure, the voltage stabilizing unit further comprises a third voltage switching element (NT6-1), the voltage switching element (NT6-1) comprises a controlling end connected to the second end of the second switching element (NT2), a first end connected to the controlling end of the second voltage switching element (NT5-1), and a second end connected to the low voltage level terminal (VGL).

In one embodiment of the present disclosure, the voltage stabilizing unit further comprises a stabilizing capacitor, the stabilizing capacitor is connected between the Q1 node and the low voltage level terminal (VGL).

In one embodiment of the present disclosure, before a voltage of the Q1 node is reduced, the high voltage level terminal (VGH) charges the Q2 node through a first voltage switching element (NT7-1), so that the single type GOA circuit maintains the Q2 node at a high voltage during a touch time.

In one embodiment of the present disclosure, the pull-up unit comprises a ninth switching element (NT9), the ninth switching element (NT9) comprises a first end connected to a clock signal, a second end connected to a first end of a tenth switching element (NT10) of the pull-down unit and an output of the single type GOA circuit, and a controlling end connected to the second end of the seventh switching element (NT7).

In one embodiment of the present disclosure, the pull-down unit comprises a tenth switching element (NT10), the tenth switching element (NT10) comprises a first end connected to a second end of a ninth switching element (NT9) of the pull-up unit, a second end connected to the low voltage level terminal (VGL), and a controlling end connected to the pull-down controlling unit.

In one embodiment of the present disclosure, the pull-down controlling unit comprises a third switching element (NT3), a fourth switching element (NT4), an eighth switching element (NT8), and a fifth switching element (NT5); wherein the third switching element (NT3) comprises a controlling end connected to the forward scan signal (U2D), a first end connected to an (n+1)th stage clock signal (CK(n+1)); the fourth switching element (NT4) comprises a controlling end connected to the reverse scan signal (D2U), a first end connected to an (n−1)th stage clock signal (CK(n−1)), and a second end connected to a second end of the third switching element (NT3); the eighth switching element (NT8) comprises a controlling end connected to the second end of the third switching element (NT3), a first end connected to the high voltage level terminal (VGH), and a second end connected to the first end of the sixth switching element (NT6); the fifth switching element (NT5) comprises a controlling end connected to a controlling end of a tenth switching element (NT10) of the pull-down unit, a first end connected to the Q2 node, and a second end connected to the low voltage level terminal (VGL).

The beneficial effect is that the level transmission of the GOA unit reduces the requirement for the waveforms of G(n−2) node, thereby enhancing the reliability of the level transmission of the GOA unit and improving the stability of the operation in normal display and TP term of the GOA unit. In addition, it is possible to reduce the influence of the active area of the panel on the level transmission of the GOA unit through the G(n+2) node by the design of the voltage stabilizing unit 6. Thus, the panel flicker can be reduced, and the reliability of the level transmission can be improved.

DETAILED DESCRIPTION OF PREFERRED EMBODIMENTS

Structure and technical means adopted by the present disclosure to achieve the above and other objects can be best understood by referring to the following detailed description of the preferred embodiments and the accompanying drawings. Furthermore, directional terms described by the present disclosure, such as upper, lower, front, back, left, right, inner, outer, side, longitudinal/vertical, transverse/horizontal, etc., are only directions by referring to the accompanying drawings, and thus the used directional terms are used to describe and understand the present disclosure, but the present disclosure is not limited thereto.

Figure 1:
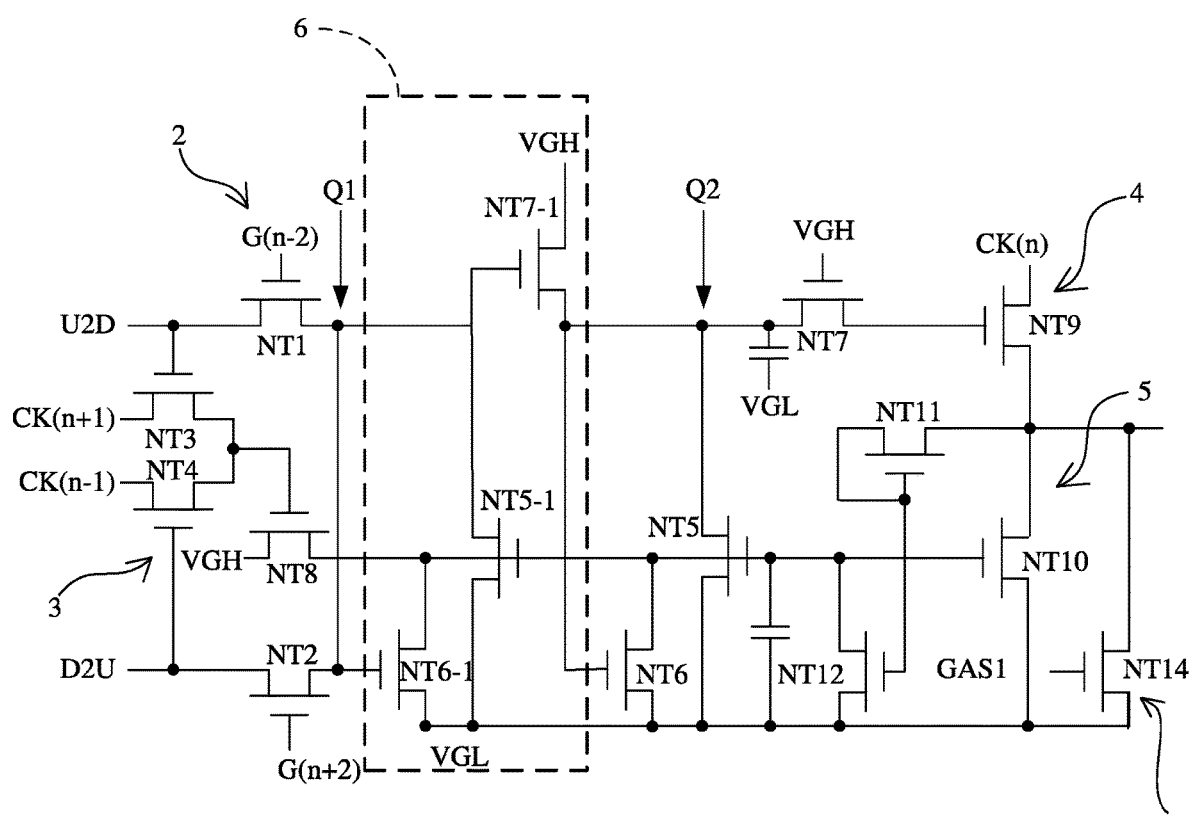
FIG. 1 is a schematic diagram of a single type GOA circuit according to a first preferred embodiment of the present disclosure.

Referring to FIG. 1, a schematic diagram of a single type gate driver on array (GOA) circuit according to a first preferred embodiment of the present disclosure is illustrated. The single type GOA circuit comprises a plurality of cascade GOA units, wherein the nth stage GOA unit comprises a pull-up controlling unit 2, a pull-down controlling unit 3, a pull-up unit 4, a pull-down unit 5, a voltage stabilizing unit 6, and a circuit detecting unit 7. The detailed structure of each component, assembly relationships, and principles of operation in the present invention will be described in detail hereinafter.

Referring to FIG. 1, the pull-up controlling unit comprises a first switching element NT1, a second switching element NT2, a sixth switching element NT6, and a seventh switching element NT7. The first switching element NT1 comprises a controlling end, a first end, and a second end, wherein the controlling end of the first switching element NT1 is connected to a gate signal G(N−2) input from the (N−2)th stage GOA unit, the first end of the first switching element NT1 is connected to a forward scan signal U2D, and the second end of the first switching element NT1 is formed with a Q1 node. The second switching element NT2 comprises a controlling end, a first end, and a second end, wherein the controlling end of the second switching element NT2 is connected to a gate signal G(N+2) input from the (N+2)th stage GOA unit, the first end of the second switching element NT2 is connected to a reverse scan signal D2U, and the second end of the second switching element NT2 is connected to the second end of the first switching element NT1. The sixth switching element NT6 comprises a controlling end, a first end, and a second end, wherein the controlling end of the sixth switching element NT6 is connected to a first voltage switching element NT7-1 of the voltage stabilizing unit 6, the first end of the sixth switching element NT6 is connected to a fifth switching element of the pull-down controlling unit 3, and the second end of the sixth switching element NT6 is connected to a low voltage level terminal VGL. The seventh switching element NT7 comprises a controlling end, a first end, and a second end, wherein the controlling end of the seventh switching element NT7 is connected to a high voltage level terminal VGH, the first end of the seventh switching element NT7 is formed with a Q2 node, and the second end of the seventh switching element NT7 is connected to a ninth switching element NT9 of the pull-up unit 4. The high voltage level terminal VGH and the low voltage level terminal VGL are configured to be input a constant-voltage high potential signal and a constant-voltage low potential signal, respectively. The voltage value of which can be adjusted by using transistor.

Referring to FIG. 1, the pull-down controlling unit 3 comprises a third switching element NT3, a fourth switching element NT4, an eighth switching element NT8, and a fifth switching element NT5. The third switching element NT3 comprises a controlling end, a first end, and a second end, wherein the first end of the third switching element NT3 is connected to the forward scan signal U2D, and the first end of the third switching element NT3 is connected to an (n+1)th stage clock signal CK(n+1). The fourth switching element NT4 comprises a controlling end, a first end, and a second end, wherein the controlling end of the fourth switching element NT4 is connected to the reverse scan signal D2U, the first end of the fourth switching element NT4 is connected to an (n−1)th stage clock signal CK(n−1), and the second end of the fourth switching element NT4 is connected to the second end of the third switching element NT3. The eighth switching element NT8 comprises a controlling end, a first end, and a second end, wherein the controlling end of the eighth switching element NT8 is connected to the second end of the third switching element NT3, the first end of the eighth switching element NT8 is connected to the high voltage level terminal VGH, and the second end of the eighth switching element NT8 is connected to the first end of the sixth switching element NT6. The fifth switching element NT5 comprises a controlling end, a first end, and a second end, wherein the controlling end of the fifth switching element NT5 is connected to a controlling end of a tenth switching element NT10 of the pull-down unit 5, the first end of the fifth switching element NT5 is connected to the Q2 node, and the second end of the fifth switching element NT5 is connected to the low voltage level terminal VGL.

Referring to FIG. 1, the pull-up unit 4 comprises a ninth switching element NT9, and the ninth switching element NT9 comprises a controlling end, a first end, and a second end, wherein the controlling end of the ninth switching element NT9 is connected to the second end of the seventh switching element NT7, the first end of the ninth switching element NT9 is connected to a clock signal CK(n), and a second end of the ninth switching element NT9 is connected to a first end of a tenth switching element NT10 of the pull-down unit 5 and an output of the single type GOA circuit.

Referring to FIG. 1, the pull-down unit 5 is connected to the pull-up unit 4, and the pull-down unit 5 comprises the tenth switching element NT10. Specifically, the tenth switching element NT10 comprises a controlling end, a first end, and a second end, wherein the controlling end of the tenth switching element NT10 is connected to the controlling end of the fifth switching element NT5 and the first end of the sixth switching element NT6, the first end of the tenth switching element NT10 is connected to the second end of the ninth switching element NT9 of the pull-up unit 4, and the second end of the tenth switching element NT10 is connected to the low voltage level terminal VGL.

Referring to FIG. 1, the voltage stabilizing unit 6 is connected between the Q1 node and the Q2 node, and a leakage path of the second switching element NT2 is reduced through connecting the voltage stabilizing unit 6 to the high voltage level terminal VGH. Furthermore, the voltage stabilizing unit 6 comprises a first voltage switching element NT7-1, a second voltage switching element NT5-1, and a third voltage switching element NT6-1. The first voltage switching element NT7-1 comprises a controlling end, a first end, and a second end, wherein the controlling end of the first voltage switching element NT7-1 is connected to the Q1 node, the first end of the first voltage switching element NT7-1 is connected to the high voltage level terminal VGH, and the second end of the first voltage switching element NT7-1 is connected to the controlling end of the sixth switching element NT6 and the Q2 node. The second voltage switching element NT5-1 comprises a controlling end, a first end, and a second end, wherein the controlling end of the second voltage switching element NT5-1 is connected to the first end of the sixth switching element NT6 and the controlling end of the fifth switching element NT5, the first end of the second voltage switching element NT5-1 is connected to the Q1 node, and the second end of the second voltage switching element NT5-1 is connected to the low voltage level terminal VGL.

Referring to FIG. 1, the circuit detecting unit 7 is configured to connect to the pull-up unit 4 and the pull-down unit 5 for detecting the circuit during a pause delivery period of the single type GOA circuit. The circuit detecting unit 7 comprises an eleventh switching element NT11, a twelfth switching element NT12, and a fourteenth switching element NT14. The eleventh switching element NT11 comprises a controlling end, a first end, and a second end, wherein the controlling end of the eleventh switching element NT11 is connected to the first end of the eleventh switching element NT11, and the second end of the eleventh switching element NT11 is connected to the second end of the ninth switching element NT9 of the pull-up unit 4, the first end of the tenth switching element NT10 of the pull-down unit 5, and the output. The twelfth switching element NT12 comprises a controlling end, a first end, and a second end, wherein the controlling end of the twelfth switching element NT12 is connected to the first end of the eleventh switching element NT11, the first end of the twelfth switching element NT12 is connected to the low voltage level terminal VGL, and the second end of the twelfth switching element NT12 is connected to the controlling end of the fifth switching element NT5 of the pull-down controlling unit 3 and the controlling end of the tenth switching element NT10 of the pull-down unit 5. The fourteenth switching element NT14 comprises a controlling end, a first end, and a second end, wherein the first end of the fourteenth switching element NT14 is connected to the low voltage level terminal VGL, and the second end of the fourteenth switching element NT14 is connected to the output.

According to the described structure, the Q node of the GOA unit in the prior art can be separated into the Q1 node and the Q2 node through disposing the voltage stabilizing unit 6. Before a voltage of the Q1 node dropping, the high voltage level terminal VGH charges the Q2 node through the first voltage switching element NT7-1, so that so that the single type GOA circuit maintains the Q2 node at a high voltage during a touch-control time. The holding action of the transmitted signal is generated by the Q2 node. Compared with the Q node of the GOA unit in the prior art, the Q2 node can reduce the leakage path of the second switching element NT2, thereby enhancing the margin of the level transmission. In the process of holding signal, high voltage can continuously charge the Q2 node through the first voltage switching element NT7-1 if the voltage of the Q1 node does not drop too low, so that the first voltage switching element NT7-1 maintains the Q2 node at a high voltage to avoid the risk of the touch panel (TP) pausing split screen and to enhance the voltage of holding signal of the touch periods (TP term). The display panel display status can be divided into multiple display periods (Display term) and TP term. In addition, in order to reduce the influence of the second switching element NT2 on the GOA unit in the display area (active area) of the panel, it can be achieved by disposing the voltage stabilizing unit 6.

As described above, the level transmission of the GOA unit reduces the requirement for the waveforms of G(n−2) node, thereby enhancing the reliability of the level transmission of the GOA unit and improving the stability of the operation in normal display and TP term of the GOA unit. In addition, it is possible to reduce the influence of the active area of the panel on the level transmission of the GOA unit through the G(n+2) node by the design of the voltage stabilizing unit 6. Thus, the panel flicker can be reduced, and the reliability of the level transmission can be improved.

It is noted that the present disclosure further provides a display device, and the display device comprises said single type GOA circuit, wherein the drive architecture of the single type GOA circuit can use interlace or double drive. Number of phases can adopt 4CK, 6CK, or 8CK.

Figure 2:
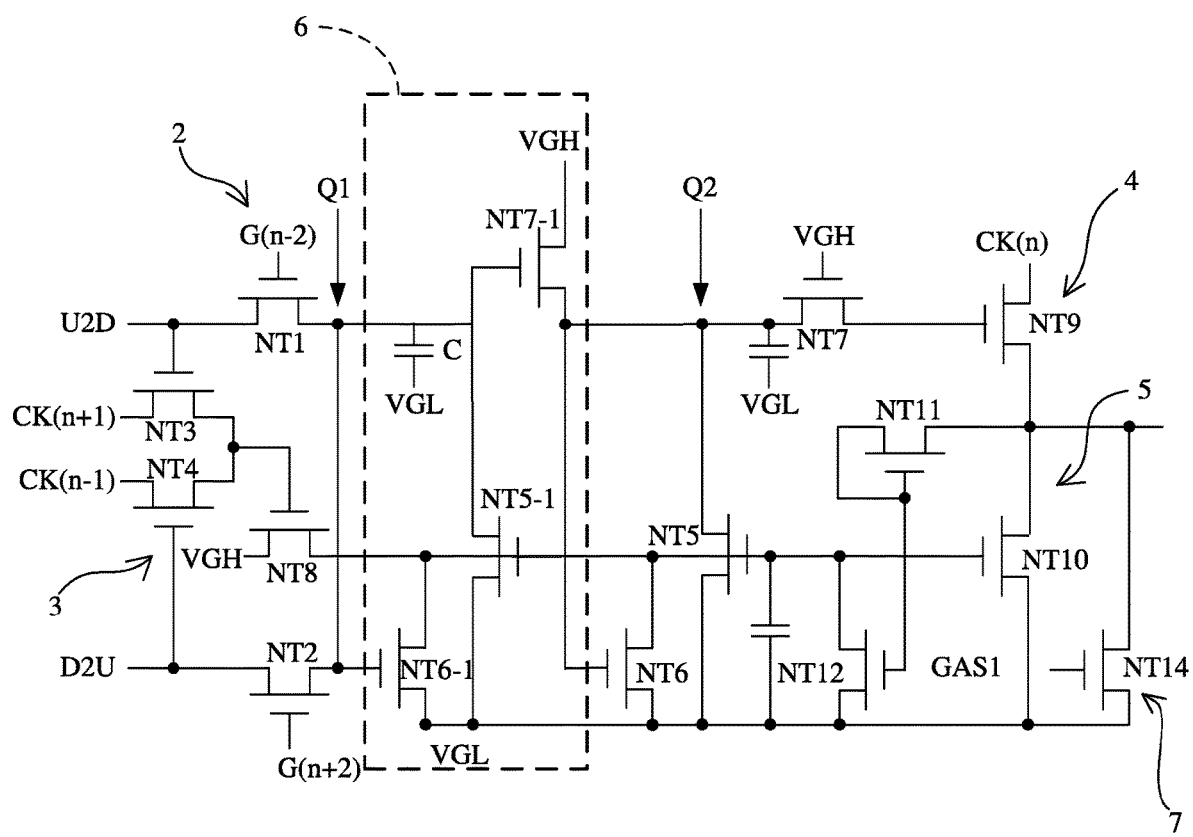
FIG. 2 is a schematic diagram of a single type GOA circuit according to a second preferred embodiment of the present disclosure.

Referring to FIG. 2, a schematic diagram of a single type GOA circuit according to a second preferred embodiment of the present disclosure is illustrated, and is similar to the first preferred embodiments. Roughly, the second preferred embodiment uses the same component name and figure number, and the difference of the second preferred embodiment is that the voltage stabilizing unit 6 further comprises a stabilizing capacitor C, wherein the stabilizing capacitor C is connected between the Q1 node formed on the second end of the first end of the switching element NT1 and the low voltage level terminal VGL. As the design of the stabilizing capacitor C of the voltage stabilizing unit 6, the voltage of the Q1 node is not easily raised from a low potential to a high potential, and an effective level of transmission can be achieved.

As described above, the level transmission of the GOA unit reduces the requirement for the waveforms of G(n−2) node, thereby enhancing the reliability of the level transmission of the GOA unit and improving the stability of the operation in normal display and TP term of the GOA unit. In addition, it is possible to reduce the influence of the active area of the panel on the level transmission of the GOA unit through the G(n+2) node by the design of the voltage stabilizing unit 6. Thus, the panel flicker can be reduced, and the reliability of the level transmission can be improved.

The present disclosure has been described with preferred embodiments thereof and it is understood that many changes and modifications to the described embodiments can be carried out without departing from the scope and the spirit of the invention that is intended to be limited only by the appended claims.

What is claimed is:

1. A single type gate driver on array (GOA) circuit, comprising:
a plurality of cascade GOA units, an nth stage GOA unit comprising: a pull-up controlling unit, a pull-down controlling unit, a pull-up unit, a pull-down unit, a voltage stabilizing unit, and a circuit detecting unit, wherein the pull-up controlling unit comprises a first switching element (NT1), a second switching element (NT2), a sixth switching element (NT6), and a seventh switching element (NT7);
the first switching element (NT1) comprises a first end connected to a forward scan signal (U2D) and a second end formed with a Q1 node; the second switching element (NT2) comprises a first end connected to a reverse scan signal (D2U) and a second end connected to the second end of the first switching element (NT1);
the sixth switching element (NT6) comprises a first end connected to the pull-down controlling unit and a second end connected to a low voltage level terminal (VGL);
the seventh switching element (NT7) comprises a first end formed with a Q2 node and a second end connected to the pull-up unit; the pull-up unit is connected to the pull-down unit, the voltage stabilizing unit is connected between the Q1 node and the Q2 node, a leakage path of the second switching element (NT2) is reduced through connecting the voltage stabilizing unit to a high voltage level terminal (VGH), and the circuit detecting unit is configured to be connected to the pull-up unit and the pull-down unit
wherein the voltage stabilizing unit comprises a first voltage switching element (NT7-1), the first voltage switching element (NT7-1) comprises a controlling end connected to the Q1 node, a first end connected to the high voltage level terminal (VGH), and a second end connected to a controlling end of the sixth switching element (NT6); and wherein the voltage stabilizing unit further comprises a second voltage switching element (NT5-1), the second voltage switching element (NT5-1) comprises a controlling end connected to the first end of the sixth switching element.

2. The single type GOA circuit according to claim 1, wherein the voltage stabilizing unit further comprises a third voltage switching element (NT6-1), the voltage switching element (NT6-1) comprises a controlling end connected to the second end of the second switching element (NT2), a first end connected to the controlling end of the second voltage switching element (NT5-1), and a second end connected to the low voltage level terminal (VGL).

3. The single type GOA circuit according to claim 2, wherein the voltage stabilizing unit further comprises a stabilizing capacitor, the stabilizing capacitor is connected between the Q1 node and the low voltage level terminal (VGL).

4. The single type GOA circuit according to claim 1, wherein before a voltage of the Q1 node is reduced, the high voltage level terminal (VGH) charges the Q2 node through the first voltage switching element (NT7-1), so that the single type GOA circuit maintains the Q2 node at a high voltage during a touch-control time.

5. The single type GOA circuit according to claim 1, wherein the pull-up unit comprises a ninth switching element (NT9), the ninth switching element (NT9) comprises a first end connected to a clock signal, a second end connected to a first end of a tenth switching element (NT10) of the pull-down unit and an output of the single type GOA circuit, and a controlling end connected to the second end of the seventh switching element (NT7).

6. The single type GOA circuit according to claim 1, wherein the pull-down unit comprises a tenth switching element (NT10), the tenth switching element (NT10) comprises a first end connected to a second end of a ninth switching element (NT9) of the pull-up unit, a second end connected to the low voltage level terminal (VGL), and a controlling end connected to the pull-down controlling unit.

7. The single type GOA circuit according to claim 1, wherein the pull-down controlling unit comprises a third switching element (NT3), a fourth switching element (NT4), an eighth switching element (NT8), and a fifth switching element (NT5); wherein the third switching element (NT3) comprises a controlling end connected to the forward scan signal (U2D), a first end connected to an (n+1)th stage clock signal (CK(n+1)); the fourth switching element (NT4) comprises a controlling end connected to the reverse scan signal (D2U), a first end connected to an (n−1)th stage clock signal (CK(n−1)), and a second end connected to a second end of the third switching element (NT3); the eighth switching element (NT8) comprises a controlling end connected to the second end of the third switching element (NT3), a first end connected to the high voltage level terminal (VGH), and a second end connected to the first end of the sixth switching element (NT6); the fifth switching element (NT5) comprises a controlling end connected to a controlling end of a tenth switching element (NT10) of the pull-down unit, a first end connected to the Q2 node, and a second end connected to the low voltage level terminal (VGL).

8. A single type gate driver on array (GOA) circuit, comprising:
a plurality of cascade GOA units, the nth stage GOA unit comprising: a pull-up controlling unit, a pull-down controlling unit, a pull-up unit, a pull-down unit, a voltage stabilizing unit, and a circuit detecting unit, wherein the pull-up controlling unit comprises a first switching element (NT1), a second switching element (NT2), a sixth switching element (NT6), and a seventh switching element (NT7);

the first switching element (NT1) comprises a first end connected to a forward scan signal (U2D) and a second end formed with a Q1 node; the second switching element (NT2) comprises a first end connected to a reverse scan signal (D2U) and a second end connected to the second end of the first switching element (NT1);

the sixth switching element (NT6) comprises a first end connected to the pull-down controlling unit and a second end connected to a low voltage level terminal (VGL);

the seventh switching element (NT7) comprises a first end formed with a Q2 node and a second end connected to the pull-up unit; the pull-up unit is connected to the pull-down unit, the voltage stabilizing unit is connected between the Q1 node and the Q2 node, a leakage path of the second switching element (NT2) is reduced through connecting the voltage stabilizing unit to a high voltage level terminal (VGH), wherein the voltage stabilizing unit comprises a first voltage switching element (NT7-1), the first voltage switching element (NT7-1) comprises a controlling end connected to the Q1 node, a first end connected to the high voltage level terminal (VGH), and a second end connected to a controlling end of the sixth switching element (NT6); and wherein the voltage stabilizing unit further comprises a second voltage switching element (NT5-1), the second voltage switching element (NT5-1) comprises a controlling end connected to the first end of the sixth switching element (NT6), a first end connected to the Q1 node, and a second end connected to the low voltage level terminal (VGL).

9. The single type GOA circuit according to claim 8, wherein the voltage stabilizing unit further comprises a third voltage switching element (NT6-1), the voltage switching element (NT6-1) comprises a controlling end connected to the second end of the second switching element (NT2), a first end connected to the controlling end of the second voltage switching element (NT5-1), and a second end connected to the low voltage level terminal (VGL).

10. The single type GOA circuit according to claim 8, wherein the voltage stabilizing unit further comprises a stabilizing capacitor, the stabilizing capacitor is connected between the Q1 node and the low voltage level terminal (VGL).

11. The single type GOA circuit according to claim 8, wherein before a voltage of the Q1 node is reduced, the high voltage level terminal (VGH) charges the Q2 node through a first voltage switching element (NT7-1), so that the single type GOA circuit maintains the Q2 node at a high voltage during a touch time.

12. The single type GOA circuit according to claim 8, wherein the pull-up unit comprises a ninth switching element (NT9), the ninth switching element (NT9) comprises a first end connected to a clock signal, a second end connected to a first end of a tenth switching element (NT10) of the pull-down unit and an output of the single type GOA circuit, and a controlling end connected to the second end of the seventh switching element (NT7).

13. The single type GOA circuit according to claim 8, wherein the pull-down unit comprises a tenth switching element (NT10), the tenth switching element (NT10) comprises a first end connected to a second end of a ninth switching element (NT9) of the pull-up unit, a second end connected to the low voltage level terminal (VGL), and a controlling end connected to the pull-down controlling unit.

14. The single type GOA circuit according to claim 8, wherein the pull-down controlling unit comprises a third switching element (NT3), a fourth switching element (NT4), an eighth switching element (NT8), and a fifth switching element (NT5); wherein the third switching element (NT3) comprises a controlling end connected to the forward scan signal (U2D), a first end connected to an (n+1)th stage clock signal (CK(n+1)); the fourth switching element (NT4) comprises a controlling end connected to the reverse scan signal (D2U), a first end connected to an (n−1)th stage clock signal (CK(n−1)), and a second end connected to a second end of the third switching element (NT3); the eighth switching element (NT8) comprises a controlling end connected to the second end of the third switching element (NT3), a first end connected to the high voltage level terminal (VGH), and a second end connected to the first end of the sixth switching element (NT6); the fifth switching element (NT5) comprises a controlling end connected to a controlling end of a tenth switching element (NT10) of the pull-down unit, a first end connected to the Q2 node, and a second end connected to the low voltage level terminal (VGL).

* * * * *